(12) United States Patent
Baloglu et al.

(10) Patent No.: US 10,504,827 B2
(45) Date of Patent: Dec. 10, 2019

(54) SEMICONDUCTOR DEVICE AND MANUFACTURING METHOD THEREOF

(71) Applicant: Amkor Technology, Inc., Tempe, AZ (US)

(72) Inventors: Bora Baloglu, Chandler, AZ (US); Ron Huemoeller, Gilbert, AZ (US); Curtis Zwenger, Chandler, AZ (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/173,116

(22) Filed: Jun. 3, 2016

(65) Prior Publication Data

US 2017/0352613 A1 Dec. 7, 2017

(51) Int. Cl.

| H01L 23/498 | (2006.01) |
|---|---|
| H01L 21/48 | (2006.01) |
| H01L 21/56 | (2006.01) |
| H01L 21/78 | (2006.01) |
| H01L 23/18 | (2006.01) |
| H01L 23/31 | (2006.01) |

(Continued)

(52) U.S. Cl.
CPC .... *H01L 23/49838* (2013.01); *H01L 21/4853* (2013.01); *H01L 21/4857* (2013.01); *H01L 21/561* (2013.01); *H01L 21/565* (2013.01); *H01L 21/78* (2013.01); *H01L 23/16* (2013.01); *H01L 23/18* (2013.01); *H01L 23/3114* (2013.01); *H01L 23/49811* (2013.01); *H01L 23/49816* (2013.01); *H01L 23/49822* (2013.01); *H01L 24/19* (2013.01); *H01L 24/96* (2013.01); *H01L 21/568* (2013.01); *H01L 23/3128* (2013.01); *H01L 2224/04105* (2013.01); *H01L 2224/12105* (2013.01); *H01L 2224/94* (2013.01); *H01L 2224/97* (2013.01); *H01L 2924/1815* (2013.01); *H01L 2924/351* (2013.01)

(58) Field of Classification Search
CPC ............ H01L 23/3107; H01L 23/3114; H01L 23/3121; H01L 23/3171; H01L 23/3185; H01L 23/3135; H01L 23/563; H01L 25/042; H01L 25/0655; H01L 25/072; H01L 25/0753; H01L 25/115; H01L 2225/1058; H01L 23/3157; H01L 24/20; H01L 23/5383–5386

See application file for complete search history.

(56) References Cited

U.S. PATENT DOCUMENTS 5,497,033 A * 3/1996 Fillion ................. H01L 21/568
257/700
6,159,837 A * 12/2000 Yamaji .................... H01L 24/11
257/E21.508

(Continued)

OTHER PUBLICATIONS

Wolf, Silicon Processing for the VLSI Era—vol. 2:Process Integration, Lattice Press, p. 337 (Year: 1990).*

*Primary Examiner* — David A Zarneke
(74) *Attorney, Agent, or Firm* — McAndrews, Held & Malloy, Ltd.

(57) ABSTRACT

An electronic device and a method of manufacturing an electronic device. As non-limiting examples, various aspects of this disclosure provide various methods of manufacturing electronic devices, and electronic devices manufactured thereby, that comprise utilizing metal studs to further set a semiconductor die into the encapsulant.

7 Claims, 11 Drawing Sheets

(51) Int. Cl.
*H01L 23/16* (2006.01)
*H01L 23/00* (2006.01)

(56) References Cited

U.S. PATENT DOCUMENTS

| | | | | |
|---|---|---|---|---|
| 6,972,964 B2* | 12/2005 | Ho | H01L 23/5389 | 257/E23.178 |
| 7,456,089 B2* | 11/2008 | Aiba | H01L 23/3114 | 257/E23.021 |
| 7,459,340 B2* | 12/2008 | Wakabayashi | H01L 23/3114 | 257/698 |
| 7,619,901 B2* | 11/2009 | Eichelberger | H01L 21/6835 | 361/763 |
| 7,622,805 B2* | 11/2009 | Usui | H01L 21/568 | 257/725 |
| 7,781,338 B2* | 8/2010 | Watanabe | H01L 23/3114 | 257/758 |
| 7,880,297 B2* | 2/2011 | Jao | H01L 23/3128 | 257/684 |
| 7,935,570 B2* | 5/2011 | Lin | H01L 23/3128 | 257/686 |
| 7,952,185 B2* | 5/2011 | Theuss | B81B 7/007 | 257/678 |
| 7,995,344 B2* | 8/2011 | Dando, III | H05K 7/20445 | 361/710 |
| 8,288,201 B2* | 10/2012 | Pagaila | H01L 21/56 | 257/687 |
| 8,361,842 B2* | 1/2013 | Yu | H01L 21/561 | 257/E21.499 |
| 8,552,553 B2* | 10/2013 | Lo | H01L 23/3192 | 257/737 |
| 8,558,372 B2* | 10/2013 | Negoro | H01L 23/13 | 257/706 |
| 8,653,674 B1* | 2/2014 | Darveaux | H01L 24/06 | 257/659 |
| 8,658,467 B2* | 2/2014 | Park | H01L 21/563 | 438/107 |
| 8,680,647 B2* | 3/2014 | Yu | H01L 23/3192 | 257/528 |
| 8,785,299 B2* | 7/2014 | Mao | H01L 23/48 | 257/678 |
| 8,962,392 B2* | 2/2015 | Kao | H01L 21/563 | 156/311 |
| 8,987,884 B2* | 3/2015 | Chen | H01L 23/49827 | 257/685 |
| 9,005,586 B2* | 4/2015 | Prencipe | A61K 8/24 | 424/49 |
| 9,053,989 B2* | 6/2015 | Kuo | H01L 24/14 | |
| 9,236,323 B2* | 1/2016 | Kourakata | H01L 23/3677 | |
| 9,245,833 B2* | 1/2016 | Chen | H01L 23/3185 | |
| 9,391,041 B2* | 7/2016 | Lin | H01L 24/19 | |
| 9,406,658 B2* | 8/2016 | Lee | H01L 25/16 | |
| 9,530,758 B2* | 12/2016 | Mallik | H01L 25/0657 | |
| 9,576,919 B2* | 2/2017 | Scanlan | H01L 23/48 | |
| 9,583,415 B2* | 2/2017 | Yu | H01L 23/42 | |
| 9,589,920 B2* | 3/2017 | Hurwitz | H01L 23/291 | |
| 9,607,917 B2* | 3/2017 | Moussaoui | H01L 23/3107 | |
| 9,659,805 B2* | 5/2017 | Hu | H01L 21/6835 | |
| 9,685,390 B2* | 6/2017 | Hu | H01L 24/24 | |
| 9,704,825 B2* | 7/2017 | Wu | H01L 25/0652 | |
| 9,735,118 B2* | 8/2017 | Wang | H01L 23/66 | |
| 9,748,209 B2* | 8/2017 | Chen | H01L 24/14 | |
| 9,818,684 B2* | 11/2017 | Hiner | H01L 21/56 | |
| 9,865,566 B1* | 1/2018 | Yu | H01L 25/0655 | |
| 9,875,988 B2* | 1/2018 | Chinnusamy | H01L 25/065 | |
| 9,922,915 B2* | 3/2018 | Pendse | H01L 23/49811 | |
| 10,242,957 B2* | 3/2019 | Kim | H01L 23/3114 | |
| 2002/0017712 A1* | 2/2002 | Bessho | H01L 21/563 | 257/700 |
| 2004/0099944 A1* | 5/2004 | Kimura | H01L 23/4334 | 257/706 |
| 2004/0145044 A1* | 7/2004 | Sugaya | H01L 21/56 | 257/698 |
| 2005/0173809 A1* | 8/2005 | Yamamoto | H01L 21/56 | 257/780 |
| 2005/0242425 A1* | 11/2005 | Leal | H01L 21/566 | 257/690 |
| 2007/0126127 A1* | 6/2007 | Jobetto | H01L 21/568 | 257/780 |
| 2009/0155956 A1* | 6/2009 | Pohl | H01L 21/568 | 438/109 |
| 2011/0068484 A1* | 3/2011 | Meyer | H01L 21/568 | 257/782 |
| 2012/0049375 A1* | 3/2012 | Meyer | H01L 21/568 | 257/773 |
| 2013/0168848 A1* | 7/2013 | Lin | H01L 24/19 | 257/737 |
| 2014/0124949 A1* | 5/2014 | Paek | H01L 23/49811 | 257/774 |
| 2014/0131856 A1* | 5/2014 | Do | H01L 21/481 | 257/737 |
| 2014/0264930 A1* | 9/2014 | Yu | H01L 24/19 | 257/774 |
| 2015/0102502 A1* | 4/2015 | Chiu | H01L 21/561 | 257/774 |
| 2016/0079204 A1* | 3/2016 | Matsubara | H01L 24/96 | 438/114 |
| 2016/0300797 A1* | 10/2016 | Shim | H01L 23/5389 | |
| 2016/0308015 A1* | 10/2016 | Shea | H01L 29/45 | |
| 2017/0033063 A1* | 2/2017 | Lin | H01L 21/565 | |

* cited by examiner

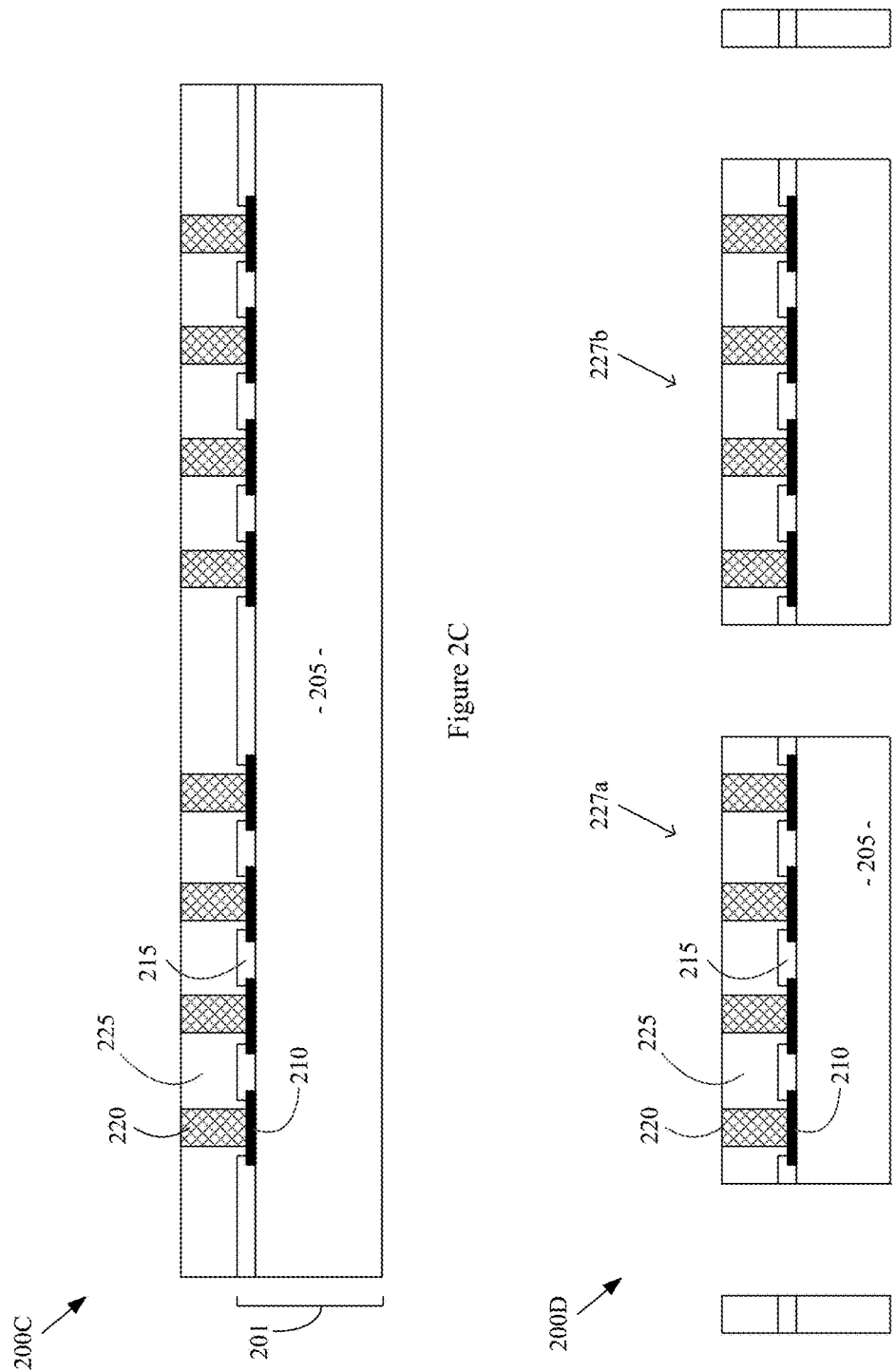

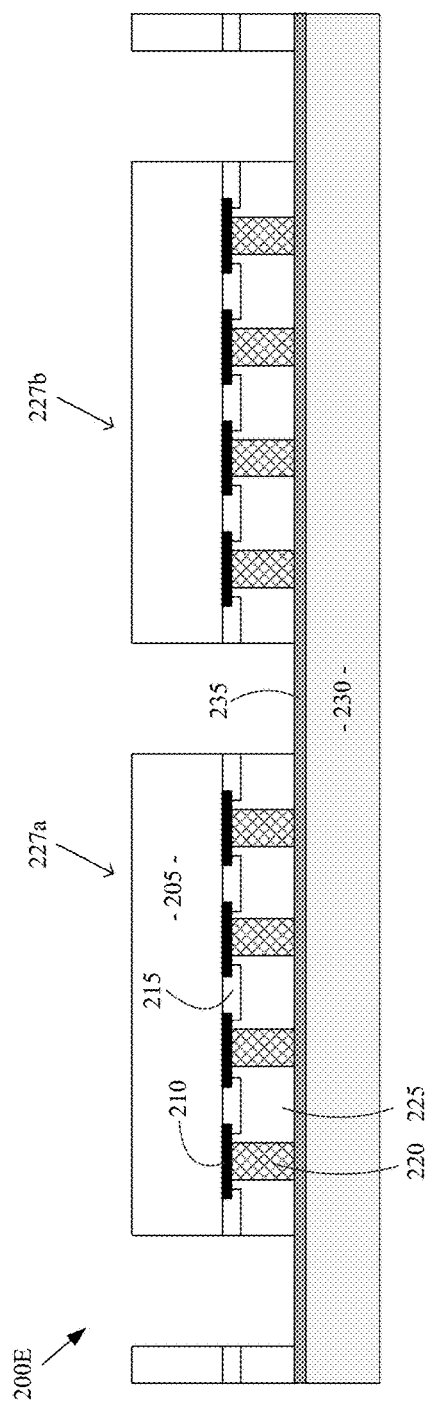
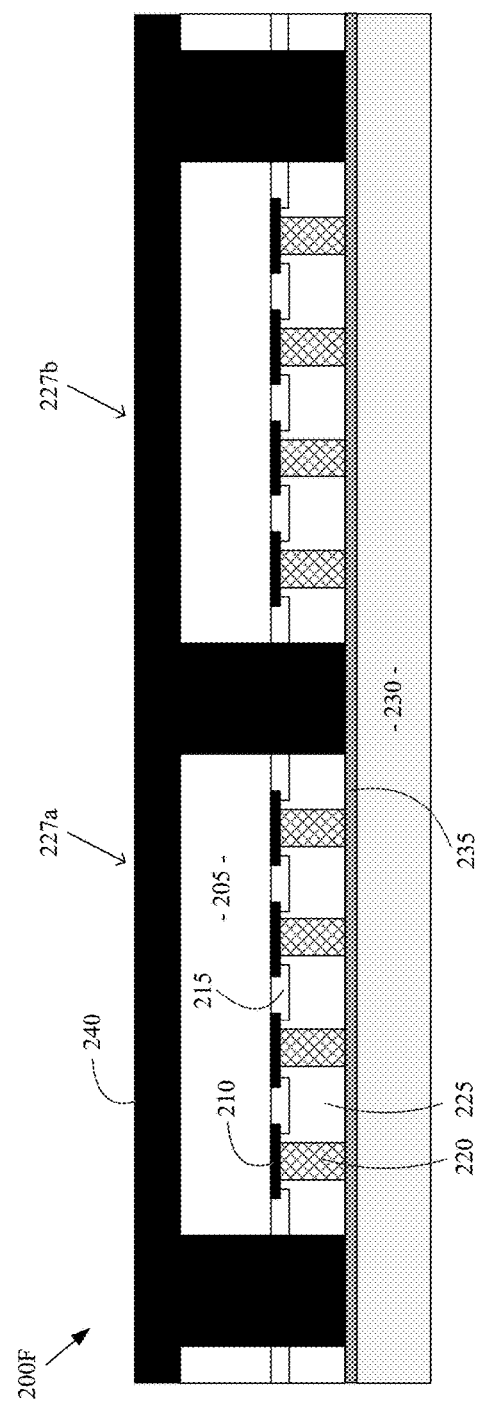
Figure 2E
Figure 2F

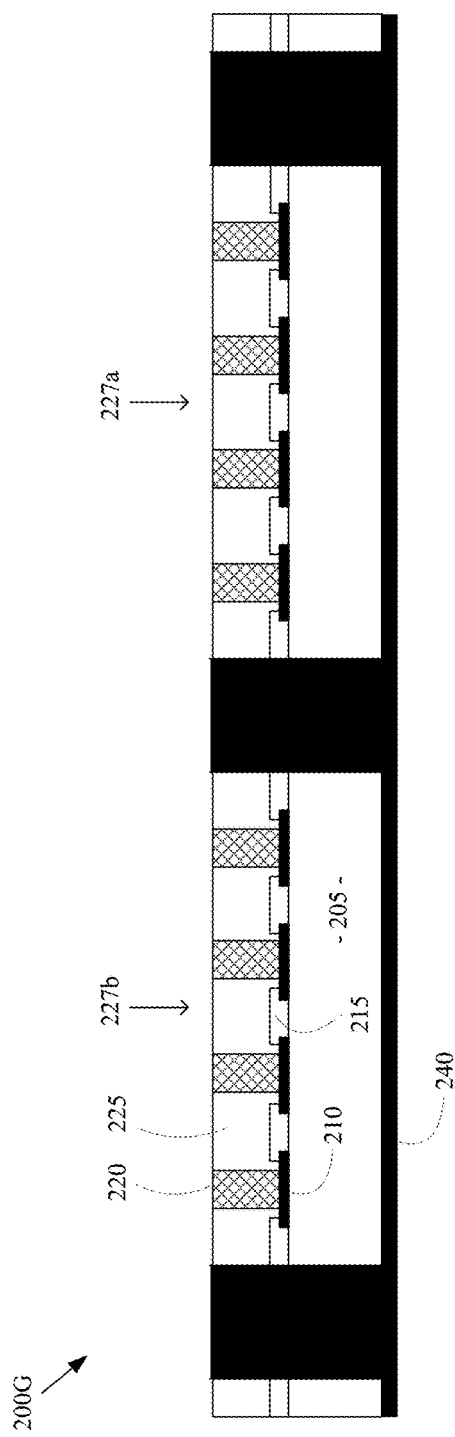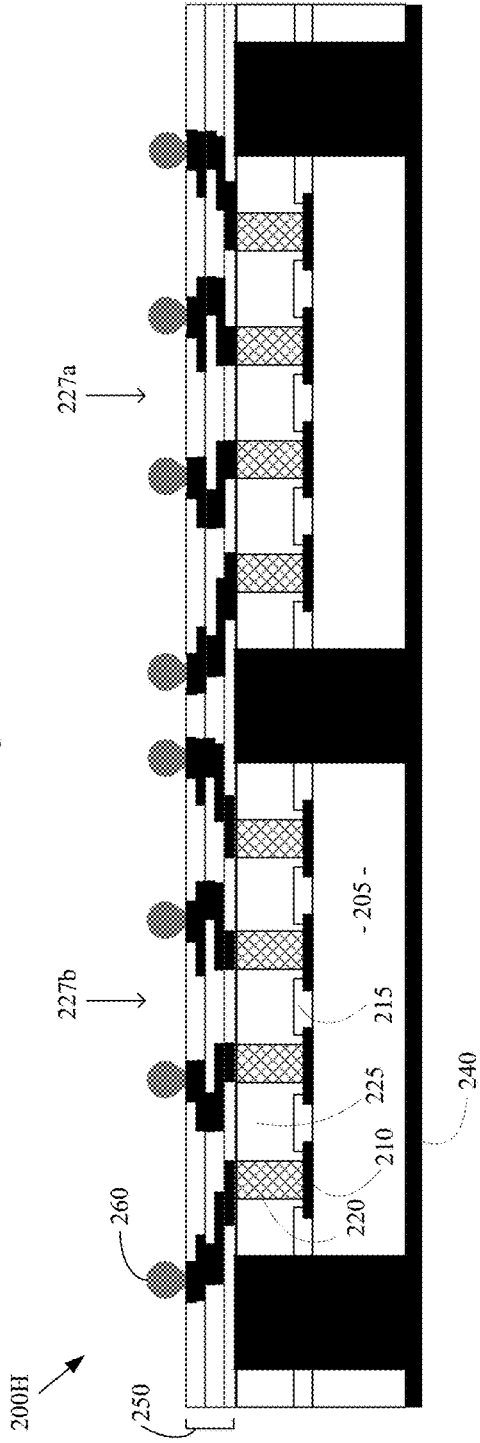

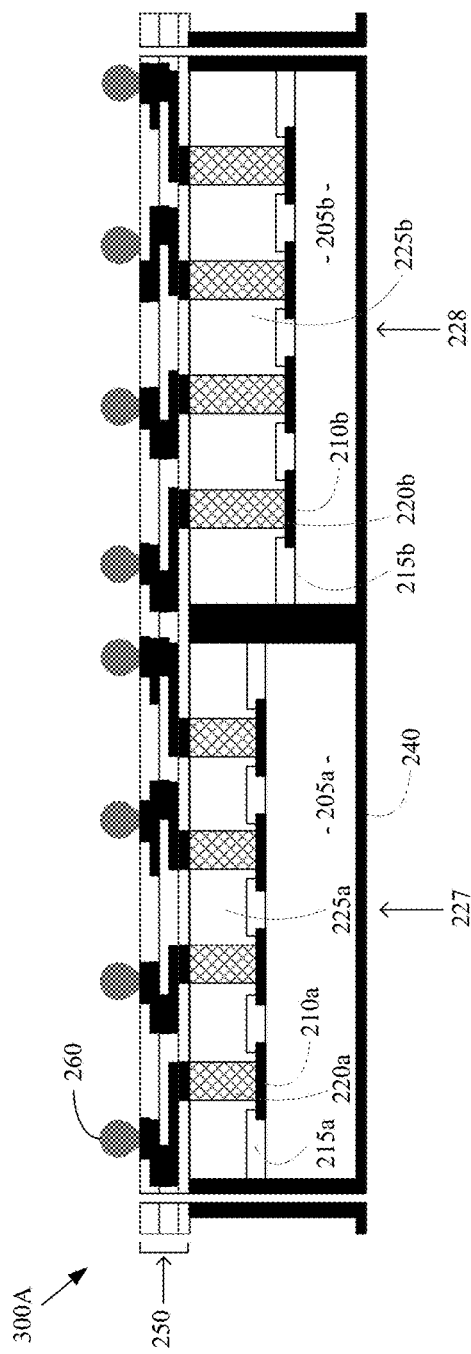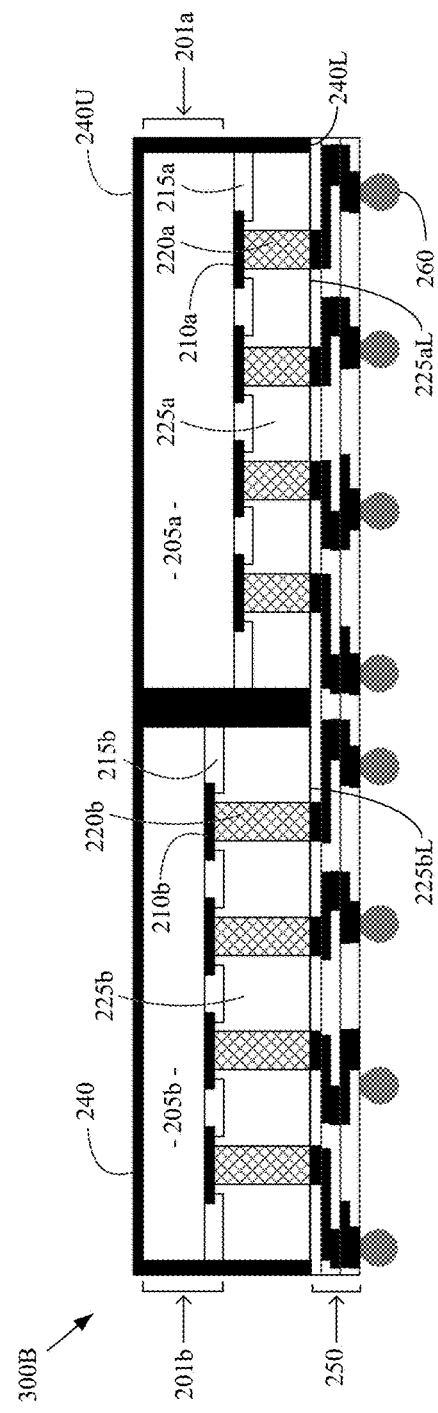
Figure 3A
Figure 3B

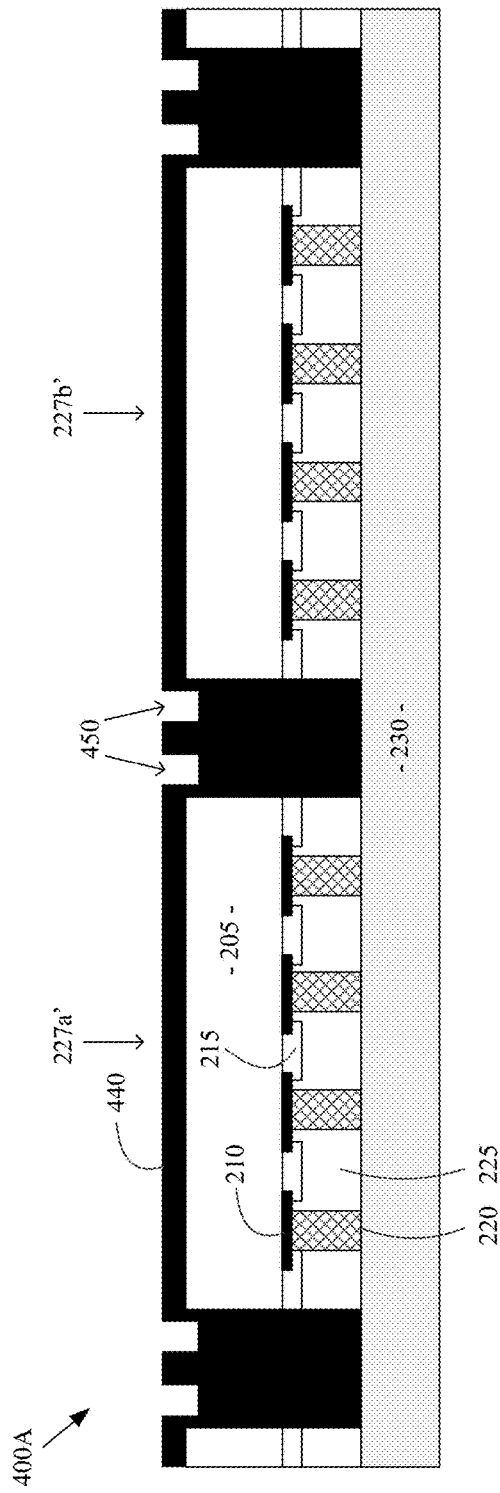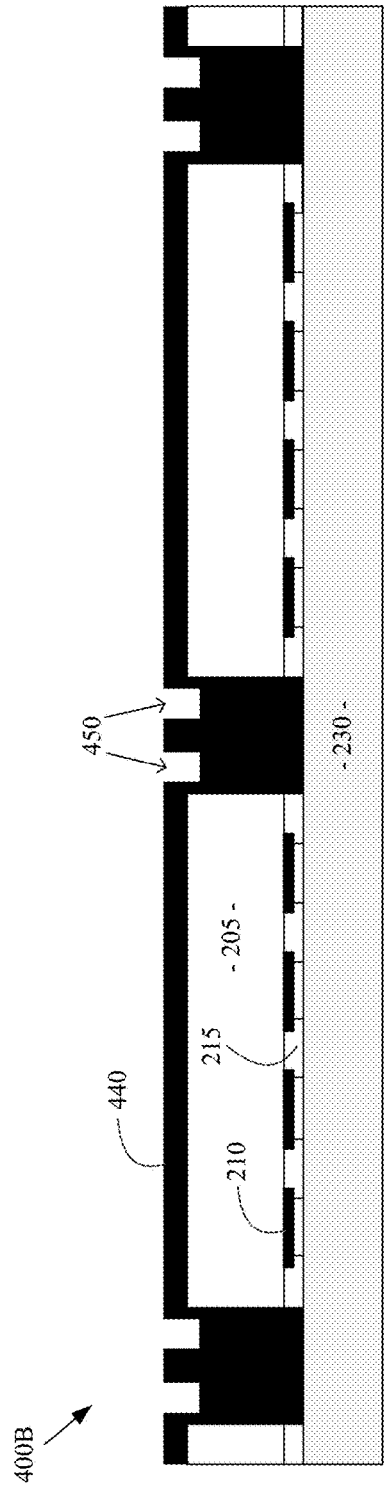
Figure 4A
Figure 4B

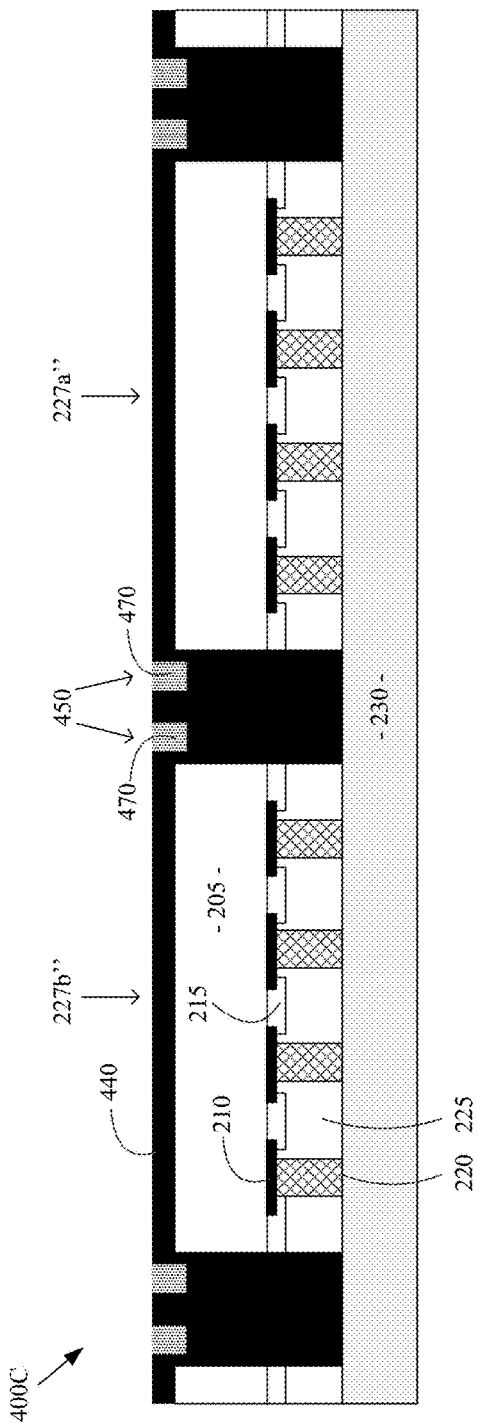
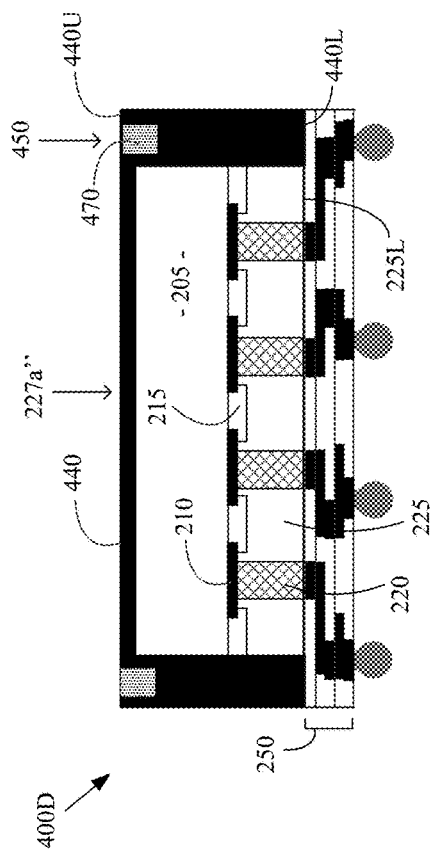
Figure 4C
Figure 4D

SEMICONDUCTOR DEVICE AND MANUFACTURING METHOD THEREOF

BACKGROUND

Present semiconductor packages and methods for forming semiconductor packages are inadequate, for example resulting in excess cost, decreased reliability (e.g., subject to thermal and/or mechanical package stress, etc.), or package sizes that are too large. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

FIGS. 2A-2K show cross-sectional views illustrating example electronic devices and example methods of manufacturing an electronic device, in accordance with various aspects of the present disclosure.

FIGS. 3A-3B show cross-sectional views illustrating example electronic devices and example methods of manufacturing an electronic device, in accordance with various aspects of the present disclosure.

FIGS. 4-4E show cross-sectional views illustrating example electronic devices and example methods of manufacturing an electronic device, in accordance with various aspects of the present disclosure.

SUMMARY

Figure 1:
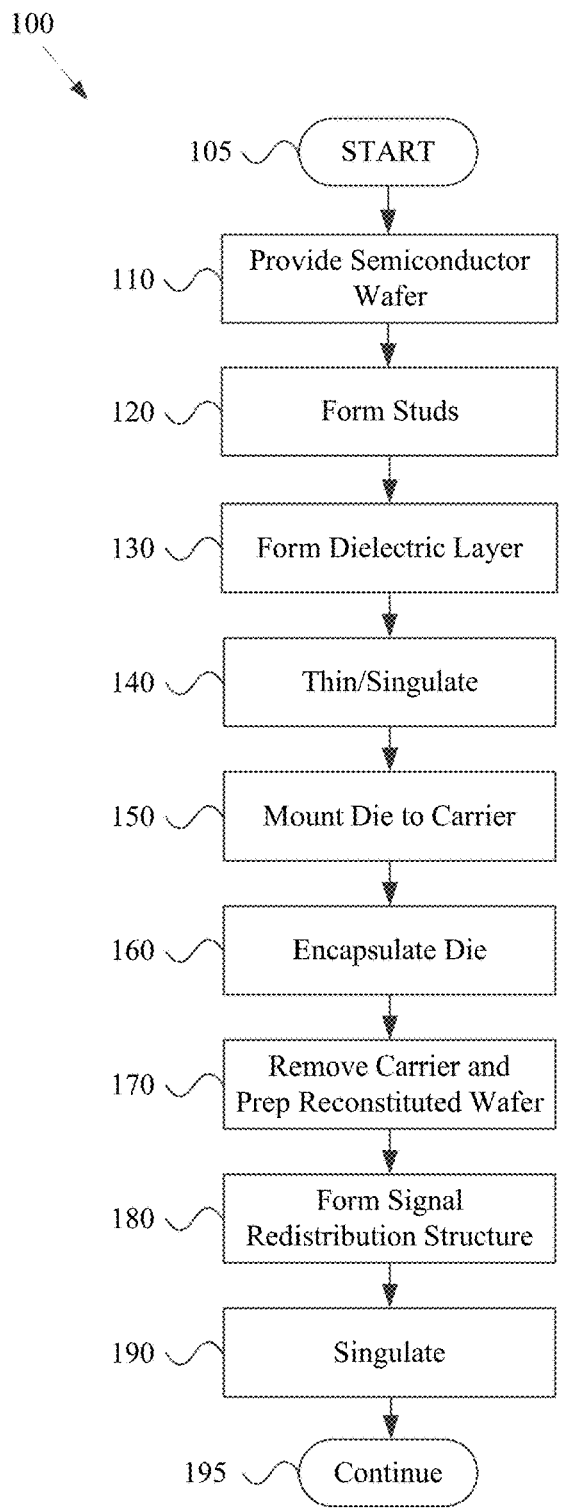
FIG. 1 shows a flow diagram of an example method of manufacturing an electronic device, in accordance with various aspects of the present disclosure.

Various aspects of this disclosure provide an electronic device and a method of manufacturing an electronic device. As non-limiting examples, various aspects of this disclosure provide various methods of manufacturing electronic devices, and electronic devices manufactured thereby, that comprise utilizing metal studs to further set a semiconductor die into the encapsulant.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion.

It will also be understood that when an element A is referred to as being "connected to" or "coupled to" an element B, the element A can be directly connected to the element B or indirectly connected to the element B (e.g., an intervening element C (and/or other elements) may be present between the element A and the element B).

Various aspects of this disclosure may provide an electronic device, and a method of manufacturing thereof, including: a semiconductor die having a top die side, a bottom die side comprising a bond pad, and lateral die sides between the top and bottom die sides; a dielectric layer (DL) having a top DL side coupled to the bottom die side, a bottom DL side, and lateral DL sides between the top and bottom DL sides; a metal post having a top post side attached to the bond pad, a bottom post side, and a lateral post surface between the top and bottom post sides, where the metal post extends vertically through the dielectric layer from the bond pad to the bottom DL side; and an encapsulating material contacting and surrounding the lateral die sides and the lateral DL sides, the encapsulating material having a top encapsulant side, a bottom encapsulant side, and lateral encapsulant sides between the top and bottom encapsulant sides.

The electronic device may, for example, include a fan-out redistribution (RD) structure coupled to the bottom DL side and the bottom encapsulant side, and connected to the bottom post side. The fan-out RD structure may, for example, include multiple layers of lateral signal routing. The volume between the semiconductor die and the RD structure may, for example, be free of lateral signal routing. The bottom post side may, for example, be coplanar with the bottom DL side and the bottom encapsulant side. The electronic device may, for example, include a redistribution (RD) structure that includes a first conductive layer, a top surface of which is connected directly to the bottom post side and extends laterally along the bottom DL side and away from the metal post. The region directly beneath the dielectric layer may, for example, be free of the encapsulating material. The top encapsulant side may, for example, include a groove outside the footprint of the semiconductor die. The groove may, for example, include a bottom end that is lower than the top die side. There may, for example, be a filler material in the groove, and the groove may laterally surround the footprint of the die.

Various aspects of this disclosure may provide an electronic device, and a method of manufacturing thereof, including: a semiconductor die having a top die side, a bottom die side comprising a bond pad, and lateral die sides between the top and bottom die sides; a dielectric layer (DL) having a top DL side coupled to the bottom die side, a bottom DL side, and lateral DL sides between the top and bottom DL sides; a metal post having a top post side attached to the bond pad, a bottom post side, and a lateral post surface between the top and bottom post sides; and an encapsulating material contacting and surrounding the lateral die sides and the lateral DL sides, the encapsulating material having a top encapsulant side, a bottom encapsulant side that is coplanar with the bottom DL side, and lateral encapsulant sides between the top and bottom encapsulant sides.

The semiconductor device may, for example, include a fan-out redistribution (RD) structure coupled to the bottom DL side and the bottom encapsulant side, and connected to the bottom post side, wherein the fan-out RD structure comprises multiple layers of lateral signal routing. The bottom post side may, for example, be coplanar with the bottom DL side and the bottom encapsulant side. The semiconductor device may, for example, include a redistribution (RD) structure comprising a first conductive layer, a top surface of which is connected directly to the bottom post side and extends laterally along the bottom DL side and away from the metal post. The region directly beneath the dielectric layer may, for example, be free of the encapsulating material.

Various aspects of this disclosure may provide an electronic device, and a method of manufacturing thereof, including: a first semiconductor die having a first top die side, a first bottom die side comprising a first bond pad, and first lateral die sides between the first top and first bottom die sides; a first dielectric layer (DL) having a first top DL side coupled to the first bottom die side, a first bottom DL side, and first lateral DL sides between the first top and first bottom DL sides; a first metal post having a first top post side attached to the first bond pad, a first bottom post side, and a first lateral post surface between the first top and first bottom post sides, where the first metal post extends vertically through the first dielectric layer from the first bond pad to the first bottom DL side; a second semiconductor die having a second top die side, a second bottom die side comprising a second bond pad, and second lateral die sides between the second top and second bottom die sides; a second dielectric layer (DL) having a second top DL side coupled to the second bottom die side, a second bottom DL side, and second lateral DL sides between the second top and second bottom DL sides; a second metal post having a second top post side attached to the second bond pad, a second bottom post side, and a second lateral post surface between the second top and second bottom post sides, where the second metal post extends vertically through the second dielectric layer from the second bond pad to the second bottom DL side; and an encapsulating material contacting and surrounding the first and second lateral die sides and the first and second lateral DL sides, the encapsulating material having a top encapsulant side, a bottom encapsulant side, and lateral encapsulant sides between the top and bottom encapsulant sides.

For example, the first DL may have a first DL thickness, and the second DL may have a second DL thickness greater than the first DL thickness. The first semiconductor die may, for example, have a first die thickness, and the second semiconductor die may have a second die thickness that is less than the first die thickness. The first top die side may be a first distance above the bottom encapsulant side, and the second top die side may be a second distance above the bottom encapsulant side, where the second distance is within a range equal to the first distance +/−10%.

The above and other aspects of the present disclosure will be described in or be apparent from the following description of various example implementations. Various aspects of the present disclosure will now be presented with reference to accompanying drawings.

FIG. 1 shows a flow diagram of an example method 100 of making an electronic device, in accordance with various aspects of the present disclosure. The example method 100 may, for example, share any or all characteristics with any other method discussed herein. FIGS. 2A-2K show cross-sectional views illustrating example electronic devices and example methods of making an electronic device, in accordance with various aspects of the present disclosure. The structures shown in 2A-2K may share any or all characteristics with analogous structures shown in FIGS. 3A-3B, FIGS. 4A-4E, etc. FIGS. 2A-2K may, for example, illustrate an example electronic device at various stages (or blocks) of the example method 100 of FIG. 1. FIGS. 1 and 2A-2K will now be discussed together. It should be noted that the order of the example blocks (or portions thereof) of the example method 100 may vary without departing from the scope of this disclosure. It should also be noted that any of the blocks (or portions thereof) may be omitted and/or additional blocks (or portions thereof) may be added without departing from the scope of this disclosure.

The example method 100 may begin executing at block 105. The example method 100 may begin executing in response to any of a variety of causes or conditions, non-limiting examples of which are provided herein. For example, the example method 100 may begin executing in response to receiving a process flow from another block of the example method 100 or another method (e.g., the example methods relating to FIGS. 2A-2K, FIGS. 3A-3B, FIGS. 4A-4E, or any portions thereof, etc.). Also for example, the example method 100 may begin executing in response to the arrival of materials utilized by the method 100, in response to the availability of processes or equipment or other resources utilized by the method 100, etc. Additionally, for example, the example method 100 may begin executing in response to a user and/or automated command to begin (e.g., from a process controller, safety system, etc.). In general, the example method 100 may begin executing in response to any of a variety of causes or conditions. Accordingly, the scope of this disclosure is not limited by characteristics of any particular initiating cause or condition.

The example method 100 may, at block 110, comprise providing a semiconductor wafer. Block 110 may comprise providing the semiconductor wafer in any of a variety of manners, non-limiting examples of which are provided herein. Though the discussion herein provides many examples of processes performed at the wafer or panel level, for example followed by singulation, it should be understood that any or all of such processes may be performed on a single device.

The semiconductor wafer may comprise any of a variety of characteristics. For example, the semiconductor wafer may be or comprise a native wafer as produced by a semiconductor wafer fabrication process. The semiconductor wafer may, for example, comprise a wafer of same semiconductor die, a wafer of different types of semiconductor dies, etc.

Figure 2A:
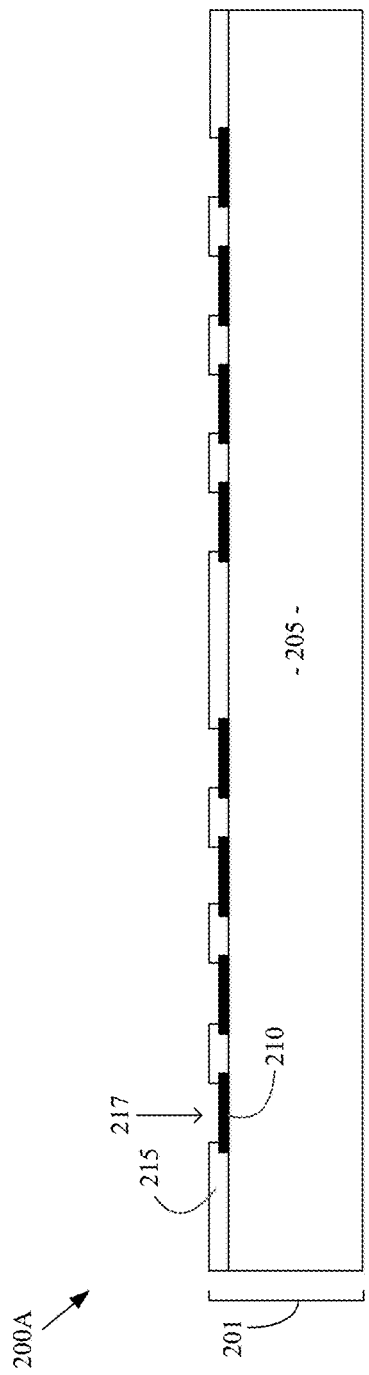

FIG. 2A provides an example illustration of various aspects of block 110. The example implementation 200A (or assembly, sub-assembly, package, etc.) comprises a semiconductor wafer 201. The example wafer 201 comprises a layer of semiconductor material 205 (e.g., silicon, gallium arsenide, etc.), in which semiconductor devices are fabricated. In the example implementation 200A as shown in FIG. 1A, the top side of the wafer 201 is the active side in/on which the semiconductor devices are fabricated, and the lower side of the wafer 201 is the inactive side that generally comprises bulk silicon.

The example wafer 201 may, for example, comprise a plurality of semiconductor dies connected to each other, wherein each of such dies comprises one or more bond pads 210 for electrical connection of the semiconductor die to another component. The example wafer 201 also comprises a die passivation layer 215 that includes a plurality of apertures 217 (or openings) through the die passivation layer 215, each of which exposing a respective one of the bond pads 210.

The passivation layer 217 (which may also be referred to as a dielectric layer) may, for example, be a native passivation layer or may be intentionally formed in a wafer fabrication process. The passivation layer 217 layer may comprise one or more layers of an inorganic dielectric material (e.g., $Si_3N_4$, $SiO_2$, SiON, SiN, oxides, nitrides, combinations thereof, equivalents thereof, etc.). Also for example, the passivation layer 217 may be formed of an organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

In an example implementation in which the passivation layer 217 is formed by a manufacturing process, for example as opposed to (or in addition to) being native, the passivation layer 217 may be formed using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LP-CVD), plasma enhanced chemical vapor deposition (PECVD), plasma vapor deposition (PVD), sheet lamination, evaporating, etc.), but the scope of the present disclosure is not limited thereto.

Note that the example wafer 201 is merely an example and is thus non-limiting. The wafer 201 may comprise any of a variety of characteristics and features (e.g., through silicon vias, active or passive circuitry, etc.). The wafer 201 may, for example, comprise an interposer wafer (e.g., having no electrical components other than routing traces, having no semiconductor circuitry, etc.).

Block 110 may comprise providing the semiconductor wafer in any of a variety of manners. For example, block 110 may comprise receiving an already-formed semiconductor wafer from a wafer fabrication facility or warehouse, from an upstream manufacturing process at a same facility, etc. Also for example, block 110 may comprise forming any or all features of the semiconductor wafer.

In general, block 110 comprises providing a semiconductor wafer. Accordingly, the scope of this disclosure should not be limited by characteristics of any particular type of semiconductor wafer or of any particular manner of providing a semiconductor wafer.

The example method 100 may, at block 120, comprise forming metal studs on the bond pads. Block 120 may comprise forming the metal studs (or posts, or pillars, or columns, or other interconnection structures, etc.) in any of a variety of manners, non-limiting examples of which are provided herein.

Block 120 may, for example, comprise forming a metal stud on any or all of the die bond pads discussed herein with regard to block 110. In an example implementation, the die bond pads may comprise any of a variety of conductive materials (e.g., copper, aluminum, silver, gold, nickel, alloys thereof, etc.). As discussed herein, each of the die bond pads may, for example, be exposed through an aperture in a passivation layer of the wafer. The passivation layer may, for example, cover side surfaces of a die bond pad and/or an outer perimeter of the top surface of a die bond pad.

Block 120 (or block 110) may, for example, comprise forming a UBM seed layer over the passivation layer and/or over the portion of the die bond pad that is exposed through a respective aperture in the passivation layer. The UBM seed layer may, for example, comprise any of a variety of conductive materials (e.g., copper, gold, silver, metal, etc.). The UBM seed layer may be formed in any of a variety of manners (e.g., sputtering, electroless plating, chemical vapor deposition (CVD), physical vapor deposition (PVD), atomic layer deposition (ALD), plasma vapor deposition, etc.).

Block 120 may, for example, comprise forming a mask (or template) over the UBM seed layer to define a region (or volume) in which a UBM and/or the metal stud (or post or pillar or column other interconnection structure) is to be formed. For example, the mask may comprise a photoresist (PR) material or other material, which may be patterned to cover regions other than the region on which a UBM and/or metal stud is to be formed. Block 120 may then, for example, comprise forming a UBM layer on the UBM seed layer exposed through the mask. As discussed herein, the UBM may comprise any of a variety of materials (e.g., titanium, chromium, aluminum, titanium/tungsten, titanium/nickel, copper, alloys thereof, etc.). Block 120 may comprise forming the UBM on the UBM seed layer in any of a variety of manners (e.g., sputtering, electroless plating, chemical vapor deposition (CVD), physical vapor deposition (PVD), atomic layer deposition (ALD), plasma vapor deposition, etc.).

Block 120 may then, for example, comprise forming the metal stud on the UBM. The metal stud may comprise any of a variety of characteristics. For example, the metal stud may be cylinder-shaped, elliptical cylinder-shaped, rectangular post-shaped, square post-shaped, etc.). The metal stud may, for example, comprise a flat upper end. The metal stud may, for example, comprise any of the materials discussed herein with regard to various conductive layers. In an example implementation, the conductive pillar may comprise copper (e.g., pure copper, copper with some impurities, etc.), a copper alloy, etc.).

After forming the metal stud, block 120 may comprise stripping or removing the mask (e.g., chemical stripping, ashing, etc.). Additionally, block 120 may comprise removing at least a portion of the UBM seed layer (e.g., at least the portion that is not covered by the metal stud (e.g., by chemically etching, etc.)). Note that during the etching of the seed layer, a lateral edge portion of at least the UBM seed layer may, for example, be etched. Such etching may, for example, result in an undercut beneath the metal stud and/or UBM.

The metal stud may, for example, comprise various dimensions. For example, block 110 may comprise forming the metal stud to be in the range of 7-10 microns thick. Also for example, block 110 may comprise forming the metal stud to be in the range of 5-20 microns thick. The metal stud may, for example, have a height that is less than a width of the metal stud (e.g., for enhanced lateral stiffness, etc.). Also for example, the metal stud may have a height that is greater than a width of the metal stud (e.g., for enhanced lateral compliance, etc.).

Figure 2B:
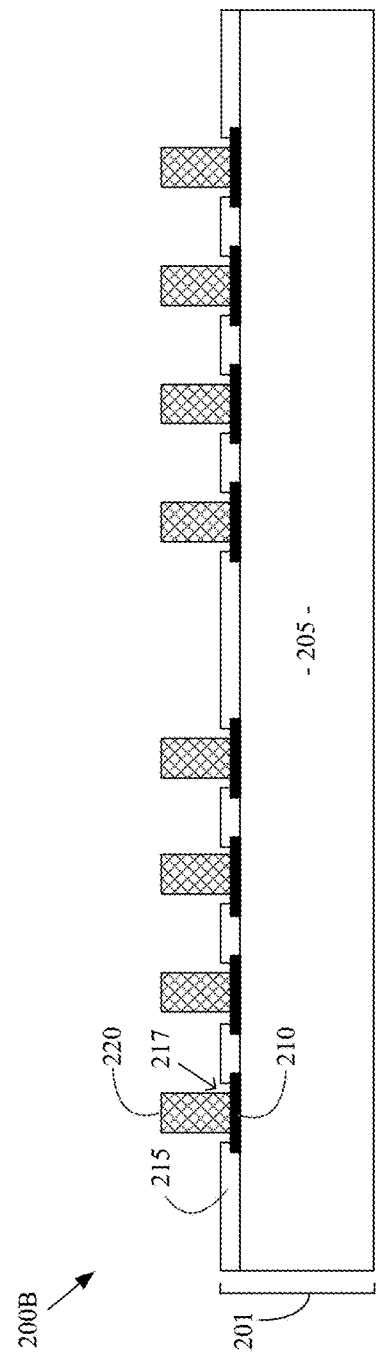

FIG. 2B provides an example illustration of various aspects of block 120. The example implementation 200B (or assembly, sub-assembly, package, etc.) comprises the example implementation 200A of FIG. 2A. A metal stud 220 is formed on each of the die bond pads 210 exposed through a respective aperture 217 in the passivation layer 215.

In general, block 120 comprises forming metal studs (or pillar, or post, or column, etc.). Accordingly, the scope of this disclosure should not be limited by characteristics of any particular type of metal stud or of any particular manner of forming a metal stud.

The example method 100 may, at block 130, comprise forming a dielectric layer. Block 130 may comprise forming a dielectric layer in any of a variety of manners, non-limiting examples of which are provided herein.

The dielectric layer may comprise one or more layers of any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

Block 130 may comprise forming the dielectric layer using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

Block 130 may comprise forming the dielectric layer to have a thickness (e.g., a height above the semiconductor wafer, bond pad, passivation layer, etc.) that is equal to the height of the metal studs (e.g., a height above the semiconductor wafer, bond pad, passivation layer, etc.) formed at block 120. For example, block 130 may comprise forming the dielectric layer to have a surface (e.g., a surface facing away from the semiconductor wafer) that is coplanar with an end surface of the metal stud (e.g., a surface facing away from the semiconductor wafer) formed at block 120.

In an example implementation, block 130 may comprise forming the dielectric layer having a height from the semiconductor die that is greater than the height of the metal studs, for example covering the metal studs. Block 130 may then, for example, comprise thinning or planarizing (e.g., grinding, performing chemical-mechanical planarization (CMP), etching, etc.) the dielectric layer and/or metal studs. For example, the surface of the dielectric layer facing away from the semiconductor die may be thinned or planarized to be coplanar with the end surface of the metal stud facing away from the semiconductor die.

In another example implementation, block 130 may comprise forming the dielectric layer having a height from the semiconductor die that is lower than the height of the metal studs from the semiconductor die, for example leaving the metal studs protruding from the dielectric layer. Block 130 may then, for example, comprise thinning or planarizing (e.g., grinding, performing chemical-mechanical planarization (CMP), etching, etc.) the metal studs and/or the dielectric layer. For example, the surface of the metal stud facing away from the semiconductor die may be thinned or planarized to be coplanar with the surface of the dielectric layer facing away from the semiconductor die.

FIG. 2C provides an example illustration of various aspects of block 130. The example implementation 200C (or assembly, sub-assembly, package, etc.) comprises the semiconductor wafer 201 and metal studs 220 of FIG. 2B. A dielectric layer 225 is formed on the passivation layer 215 and/or on a portion of the die bond pads 210 if not covered by the metal studs 220 and/or corresponding UBM. The example dielectric layer 225 comprises a surface (e.g., an upper surface in FIG. 2C) that faces away from the semiconductor die 201 and is coplanar with corresponding end surfaces of the metal studs 220.

In general, block 130 comprises forming a dielectric layer. Accordingly, the scope of this disclosure should not be limited by characteristics of any particular type of dielectric layer or of any particular manner of forming a dielectric layer.

The example method 100 may, at block 140, comprise thinning and/or singulating the wafer. Block 140 may comprise performing such thinning and/or singulating in any of a variety of manners, non-limiting examples of which are provided herein.

At any of a variety of stages of the processing of the semiconductor wafer, the wafer may be thinned. In this example implementation, the semiconductor wafer may generally be brought to its desired thickness at any point prior to singulation. Note that the thinning of individual die may be performed, but generally such thinning is performed at the wafer level (e.g., at the native wafer and/or a reconstituted wafer, etc.). Block 140 may, for example, comprise back-grinding the semiconductor wafer, or thinning the semiconductor wafer in any of a variety of manners (e.g., mechanical means, chemical means, directed energy means, etc.).

Block 140 may, for example, comprise cutting the wafer of semiconductor dies along singulation (or saw or cutting) streets between devices. Such cutting may, for example comprise laser cutting, mechanical saw cutting, plasma cutting, etc.

An example implementation 200D showing various aspects of block 140 is shown at FIG. 2D. The example implementation 200D (or assembly, sub-assembly, package, etc.) shows individual semiconductor dies 227a and 227b singulated from a panel or wafer of such devices. Along the singulation lines (or streets), the peripheral sides of the semiconductor dies 227a and 227b (e.g., of the semiconductor material 205, the passivation layer 215, the dielectric layer 225, etc.) may, for example, be coplanar.

Note that the singulating may generally, for example, be performed before or after any of the example blocks of the example method 100, for example followed by processes performed on single devices.

In general, block 140 may comprise singulating the semiconductor wafer. Accordingly, the scope of this disclosure should not be limited by characteristics of any particular type or manner of singulating.

The example method 100 may, at block 150, comprise mounting the singulated die (e.g., as formed at block 140) to a carrier. Block 150 may comprise performing such mounting (or attaching) in any of a variety of manners, non-limiting examples of which are provided herein.

The carrier may comprise any of a variety of characteristics. For example, the carrier may be or comprise glass, metal, plastic, semiconductor material, etc. The carrier may, for example, be wafer-shaped (e.g., shaped like a semiconductor wafer), panel-shaped, circular, rectangular, etc.

Block 150 may, for example, comprise attaching the singulated die to the carrier utilizing an adhesive (e.g., thermally releasable adhesive, light-releasable adhesive, etc.) or epoxy. For example, block 150 may comprise attaching the singulated die to the carrier using a die attach film (e.g., a performed adhesive sheet, a printed paste or liquid, a sprayed on epoxy, etc.). Also for example, block 150 may comprise attaching the singulated die to the carrier utilizing vacuum attachment, mechanical holding, etc.

Note that block 150 may also comprise testing the die singulated from the wafer at block 140. Block 150 may then, for example, comprise mounting only known good die to the carrier.

An example implementation 200E showing various aspects of block 150 is shown at FIG. 2E. The example implementation 200E (or assembly, sub-assembly, package, etc.) shows a plurality of singulated semiconductor dies 227a, 227b, etc., attached to the carrier 230 utilizing an adhesive layer 235. For example, end surfaces of the metal studs 220 and a surface of the dielectric layer 225 are adhered to one side of the adhesive layer 235 (e.g., a top side as shown in FIG. 2E), the other side of which is adhered to the carrier 230. Note that the singulated dies 227a, 227b, etc., are inverted relative to FIG. 2D. Note that although the adhesive layer 235 is shown covering the entire carrier 230, in an alternative implementation, the adhesive layer 235 may be applied only to the surface of the die 227a, 227b, etc., to be attached to the carrier 230.

In general, block 150 may comprise mounting the singulated die to a carrier. Accordingly, the scope of this disclosure should not be limited by characteristics of any particular type of carrier or any particular manner of attaching a die to a carrier.

The example method 100 may, at block 160, comprise encapsulating the die attached to the carrier at block 150. Block 160 may comprise performing such encapsulating in any of a variety of manners, non-limiting examples of which are provided herein.

Block 160 may, for example, comprise forming the encapsulating material to cover portions of the carrier (or adhesive layer) that are not covered by the attached die. The encapsulating material may, for example, also cover lateral sides of the attached die attached at block 150 and the dielectric layer formed at block 130. Additionally, the encapsulating material may cover the back side of the semiconductor die, or such back side may be exposed from the encapsulating material.

The encapsulating material may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). The encapsulating may, for example, comprise any of the dielectric layer materials discussed herein. Block 160 may comprise forming the encapsulating material in any of a variety of manners (e.g., compression molding, transfer molding, liquid encapsulant molding, vacuum lamination, paste printing, film assisted molding, etc.). Block 160 may, for example comprise forming the encapsulating material in any of the manners discussed herein with regard to dielectric layers.

An example implementation 200F showing various aspects of block 160 is shown at FIG. 2F. The example implementation 200F (or assembly, sub-assembly, package, etc.) shows the example implementation 200E encapsulated in an encapsulating material 240. The encapsulating material 240 covers portions of the carrier 230 (or adhesive layer 235) that are not covered by the attached die 227a, 227b, etc. The encapsulating material 240 may, for example, also cover lateral sides of the attached die 227a, 227b, etc. (e.g., of the passivation layer 215, semiconductor material 205, dielectric layer 225, etc.). Additionally, the encapsulating material 240 may cover the back side of the semiconductor die 227a, 227b, etc. (e.g., in FIG. 2F, the top side of the semiconductor material 205).

Note that the native semiconductor die of the original semiconductor wafer 201 (e.g., including the semiconductor material 205, bond pads 210, and passivation layer 215) is embedded within the encapsulating material 240 an additional amount corresponding to the height of the metal studs 220 or thickness the dielectric layer 225. Such a degree of embeddedness, for example, provides extra protection for the native semiconductor die relative to a configuration in which the native semiconductor die (e.g., the passivation layer 215) directly contacts the adhesive layer 235.

In an example implementation, discussed herein in more detail with regard to FIGS. 4A-4E, block 160 may comprise forming grooves in the encapsulating material 240, for example in a top side thereof opposite the dielectric layer and metal studs.

In general, block 160 may comprise encapsulating the die attached to the carrier. Accordingly, the scope of this disclosure should not be limited by characteristics of any particular type of encapsulating material or any particular manner of forming the encapsulating material.

The example method 100 may, at block 170, comprise removing the encapsulated die from the carrier and preparing the molded dies (which may also be referred to herein as a reconstituted wafer) for further processing. Block 170 may comprise performing such operations in any of a variety of manners, non-limiting examples of which are provided herein.

Block 170 may, for example, comprise releasing the encapsulated die from the carrier in various manners, depending on the manner in which the die were mounted (or attached) to the carrier at block 150. For example, in an example scenario in which block 150 comprised utilizing thermal release adhesive, block 170 may comprise applying heat to break the adhesive bond and then removing the adhesive from the encapsulated dies and/or the carrier (e.g., by peeling, sheering, etc.). Also for example, in an example scenario in which block 150 comprised utilizing ultraviolet (UV) release adhesive, block 170 may comprise applying UV light (e.g., through a glass carrier, etc.) to break the adhesive bond and then removing the adhesive from the encapsulated dies and/or the carrier. Additionally for example, in an example scenario in which block 150 comprised utilizing a vacuum mechanism to mount the dies to the carrier, block 170 may comprise releasing the vacuum.

Block 170 may also, for example, comprise preparing the molded dies for additional processing. For example, block 170 may comprise performing any necessary back side or front side thinning or planarization (e.g., grinding, CMP, etc.). In an example implementation, block 170 may comprise performing a cleaning and/or thinning or planarization process to expose the metal studs (e.g., for a next stage of processing).

An example implementation 200G showing various aspects of block 170 is shown at FIG. 2G. The example implementation 200G (or assembly, sub-assembly, package, etc.) shows the example implementation 200F released from the carrier 230 and adhesive layer 235. The encapsulating material 240 (e.g., relative to the example implementation 200F) has also been thinned. The top surface of the example implementation 200G in FIG. 2G shows a surface of the encapsulating material 240, a surface of the dielectric layer 225, and surfaces of the metal studs 220 being coplanar surfaces.

In general, block 170 may comprise removing the encapsulated die from the carrier and preparing the molded dies (which may also be referred to herein as a reconstituted wafer) for further processing. Accordingly, the scope of the present disclosure should not be limited by characteristics of any particular manner of removing a carrier or of any particular manner of preparing molded die (e.g., a reconstituted wafer) for further processing.

The example method 100 may, at block 180, comprise forming a redistribution structure on the molded dies (e.g., on the reconstituted wafer). Block 180 may comprise forming the redistribution (RD) structure in any of a variety of manners, non-limiting examples of which are provided herein.

The redistribution structure may, for example, comprise a fan-out redistribution structure, for example in which various signal lines to/from the bond pads semiconductor die are formed outside the footprint of the semiconductor die. Note that the various aspects of this disclosure are not limited to fan-out configurations.

The redistribution structure may generally, for example, comprise a plurality of dielectric layers and conductive layers. The conductive layers may, for example, comprise lateral trace portions that laterally distribute signal paths, and/or vertical trace portions that vertically connect the lateral trace portions to other lateral trace portions, die pad structures, package interconnection structures, etc.).

The conductive layer(s) of the redistribution structure may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto. Block 180 may comprise forming (or depositing) the conductive layer(s) utilizing any one or more of a variety of processes (e.g., electrolytic plating, electroless plating, chemical vapor deposition (CVD), sputtering or physical vapor deposition (PVD), atomic layer deposition (ALD), plasma vapor deposition, printing, screen printing, lithography, etc.), but the scope of the present disclosure is not limited thereto. Note that conductive layers may, for example, be interconnected through apertures (or openings) in the dielectric layer(s).

The dielectric layer(s) of the redistribution structure may comprise one or more layers of any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto. Block 180 may comprise forming the dielectric layer(s) using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

Block 180 may also, for example, comprise forming interconnection structures (e.g., package interconnection structures, etc.) attached to the redistribution structure. Such interconnection structures may, for example, comprise conductive bumps or balls (e.g., solder bumps or balls), metal posts or pillars (e.g., copper posts or pillars), wires, leads, etc.

An example implementation 200H showing various aspects of block 180 is shown at FIG. 2H. The example implementation 200H (or assembly, sub-assembly, package, etc.) shows the example implementation 200G with a redistribution structure 250 formed thereon, and with interconnection structures 260 formed on the redistribution structure 250. In the view shown in FIG. 2H, the redistribution structure 250 is formed on the top surfaces of the encapsulating material 240, dielectric layer 225, and metal studs 220. The conductive layers of the redistribution structure 250 are connected to the top surfaces of the metal studs 220. The example redistribution structure 250 comprises a plurality of conductive layers of lateral signal routing. The example redistribution structure 250 comprises a first conductive layer formed on the top surfaces of the metal studs 220 and on the dielectric layer 225. For example, though not required, at least some portions of such a first conductive layer may route signals laterally along the dielectric layer 225. The example redistribution structure 250 also comprises additional one or more conductive layers, at least some of which also route signals laterally. In the example implementation 200H, the only signal routing performed through the dielectric layer 225 is vertical signal routing provided by the metal studs 220. The conductive layers extend through apertures (or openings) in the dielectric layers to electrically connect to each other.

In general, block 180 may comprise forming a redistribution structure and/or interconnection structures. Accordingly, the scope of the present disclosure should not be limited by characteristics of any particular redistribution structure, or manner of forming thereof, or by any particular interconnection structure, or manner of forming thereof.

The example method 100 may, at block 190, comprise singulating the reconstituted wafer (e.g., with redistribution structure, interconnection structures, etc.). Block 190 may comprise performing such singulating in any of a variety of manners, non-limiting examples of which are provided herein.

Block 190 may, for example, comprise cutting the wafer (e.g., molded wafer, reconstituted wafer, etc.) of semiconductor devices along singulation (or saw or cutting) streets between devices. Such cutting may, for example comprise laser cutting, mechanical saw cutting, plasma cutting, etc.

Note that block 190 (or any other block) may also comprise performing a thinning operation to, for example, thin the encapsulating material and/or to expose the back side of the semiconductor die.

Figure 2I:
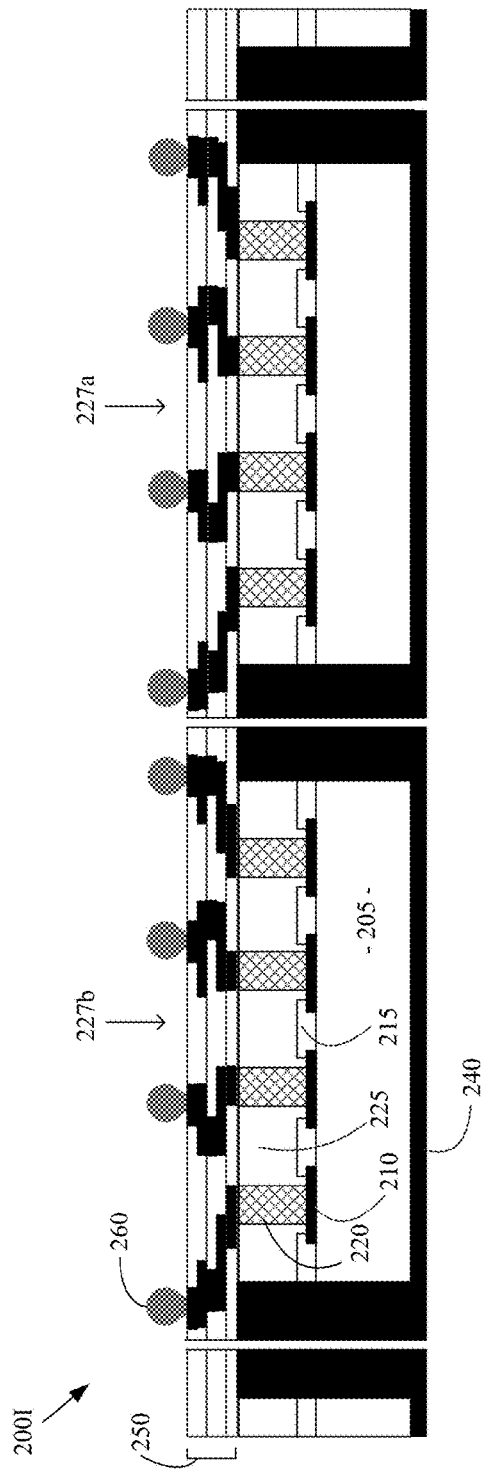

An example implementation 200I showing various aspects of block 190 is shown at FIG. 2I. The example implementation 200I (or assembly, sub-assembly, package, etc.) shows individual semiconductor devices 227*a*, 227*b*, etc., singulated from a panel or wafer of such devices. Along the singulation lines (or streets), the peripheral sides of the redistribution structure 250 (e.g., the dielectric layer(s) thereof, etc.) and the encapsulating material 240 may, for example, be coplanar.

Figure 2J:
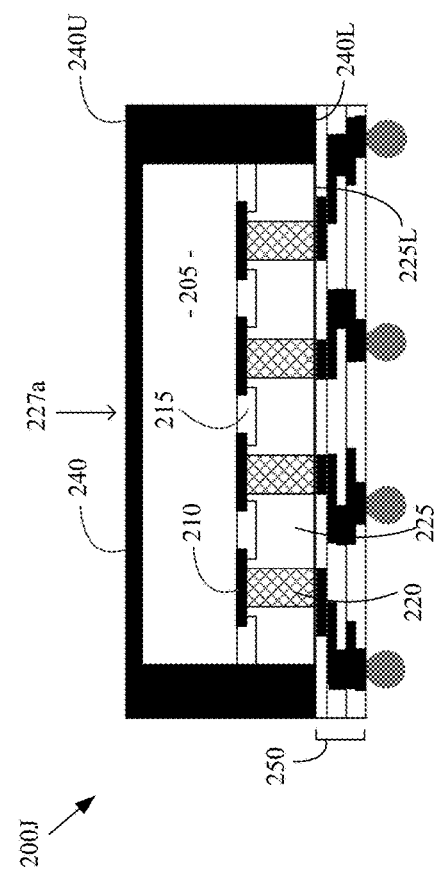

FIG. 2J shows a resulting example implementation 200J, for example a single semiconductor device 227*a*, which may be output from the example method 100. The lower side 240L of the encapsulating material 240 is coplanar with the loser side 225L of the dielectric layer 225, and/or with the lower end surfaces of the metal studs 220. The lower side 240L of the encapsulating material 240 is, for example, at a level below that of the passivation layer 215 (and/or bond pads 210) by the thickness of the dielectric layer 225 (and/or length of the metal studs 220). The lateral sides of the semiconductor material 205, passivation layer 215, and dielectric layer 225 are covered by the encapsulating material 240. The top side of the semiconductor material 205 is covered by the encapsulating material 240, but in another example implementation, the top side of the semiconductor material 205 may be exposed from the encapsulating material 240. The lateral sides of the encapsulating material 240 are coplanar with the lateral sides of the redistribution structure 250 (e.g., dielectric layers thereof, etc.), which is formed on the lower side 240L of the encapsulating material 240, the lower side 225L of the dielectric layer 225, and the lower end surfaces of the metal studs 220. The example redistribution structure 250 includes multiple conductive layers, each of which may perform lateral signal routing, though this need not be the case. Notably, in the example implementation 200J, there is no encapsulating material 240 between the dielectric layer 225 and the redistribution structure 250 or between the dielectric layer 225 and the die passivation layer 215. Also, in the example implementation 200J, there is no lateral signal distribution by the metal studs 220 within the dielectric layer 225. The scope of this disclosure, however, is not so limited.

Figure 2K:
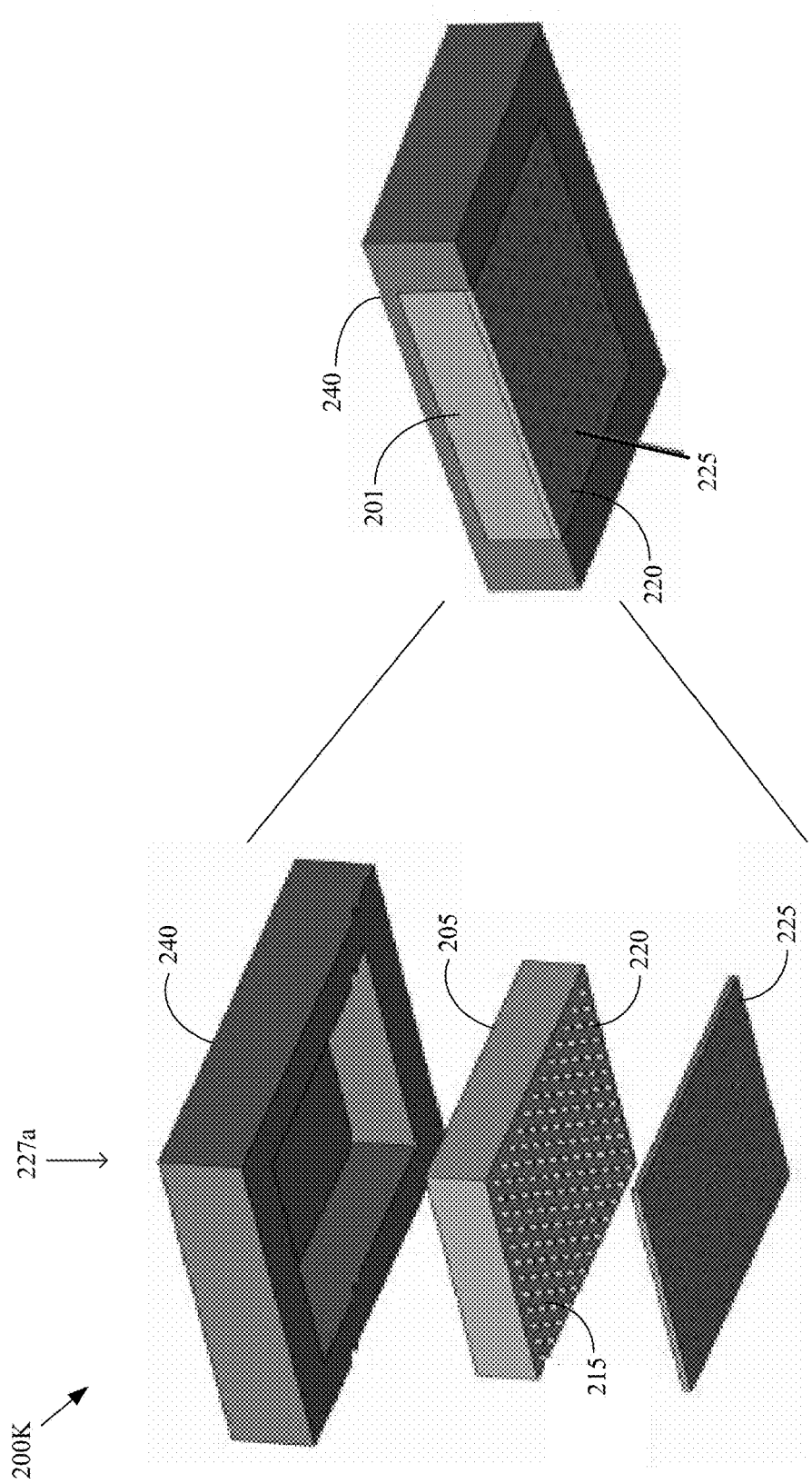

FIG. 2K provides a blow-out drawing and a perspective sectional drawing of an example electronic device 227*a* (or portions thereof), in accordance with various aspects of the present disclosure. The drawings of FIG. 2K show the native semiconductor die (e.g., the semiconductor material 205, passivation layer 215, etc.), metal studs 220, dielectric layer 225, and encapsulating material 240 discussed herein.

In general, block 190 may comprise singulating. Accordingly, the scope of this disclosure should not be limited by characteristics of any particular type or manner of singulating.

The example method 100 may, at block 195, comprise continuing the manufacturing (or processing). Block 195 may comprise continuing the manufacturing (or processing) in any of a variety of manners, non-limiting examples of which are provided herein.

For example, block 195 may comprise performing any of a variety of additional processing steps. For example, block 195 may comprise performing additional electronic device processing steps, for example, mounting the electronic device to a multi-device module substrate or motherboard, mounting additional electronic components, attaching additional device interconnection structures, performing additional encapsulating, covering, general packaging, testing, marking, shipping, etc. Also for example, block 195 may comprise directing execution flow of the example method 100 to any previous block (or portion thereof) of the example method 100. Additionally for example, block 195 may comprise directing execution flow of the example method 100 to any other method step disclosed herein (or portion thereof).

In general, block 195 may comprise continuing the manufacturing (or processing) of the electronic device. Thus, the scope of this disclosure should not be limited by characteristics of any particular manner or type of continued manufacturing (or processing).

The example method 100 is presented herein for illustrative purposes only and not by way of limitation. For example, as mentioned herein, the order of the blocks (or portions thereof) may be changed without departing from the scope of this disclosure. Also for example, various blocks (or portions thereof) may be omitted or added without departing from the scope of this disclosure.

For example, though the example implementations shown and discussed with regard to FIGS. 2A-2K included an electronic device with only a single semiconductor die, an electronic device comprising multiple semiconductor die is also within the scope of the present disclosure. An example is shown in FIGS. 3A-3B. The example implementations shown in FIGS. 3A-3B may, for example, share any or all characteristics with the example implementations shown in FIGS. 2A-2K.

In particular, example implementations 300A and 300B including a plurality of die in a single electronic device is shown at FIGS. 3A-3B, with FIG. 3A showing a wafer implementation 300A having singulation lines, and FIG. 3B showing a single device implementation 300B. A first die 227 includes semiconductor material 205*a*, bond pads 210*a*, a passivation layer 215*a*, metal studs 220*a*, and a dielectric layer 225*a*, each of which may share any or all characteristics with like-numbered and corresponding components of the example implementations of FIGS. 2A-2K. A second die 228 includes semiconductor material 205*b*, bond pads 210*b*, a passivation layer 215*b*, metal studs 220*b*, and a dielectric layer 225*b*, each of which may share any or all characteristics with like-numbered and corresponding components of the example implementations of FIGS. 2A-2K. An encapsulating material 240 encapsulates both of the example die.

In the example implementation 300A, the length (or height) of the metal studs 220*b* is greater than the length (or height) of the metal studs 220*a* (e.g., greater than by at least 5%, 10%, or 20%), and the thickness of the dielectric layer 225*b* is greater than the thickness of the dielectric layer 225*a* (e.g., thicker by at least 5%, 10%, or 20%). Thus, the native semiconductor die portion of the second die 228 (e.g., including the semiconductor material 205*b*, bond pads 210*b*, and die passivation layer 215*b*) is embedded farther into the encapsulating material 240 from the RD structure 250 than the first die native semiconductor die portion of the second die 228 (e.g., including the semiconductor material 205*a*, bond pads 210*a*, and die passivation layer 215*a*). Referring to FIG. 3B, the top surfaces of the first and second semiconductor dies 227 and 228 may be at the same height from the RD structure 250. In another example implementation, the height of the top surface of the first semiconductor die 227 above the RD structure 250 may be within 5% or 10% of the height of the top surface of the second semiconductor die 228 above the RD structure 250.

As discussed herein with regard to the example method 100 of FIG. 1, block 160 may comprise forming grooves in the encapsulating material (e.g., at a top side of the encapsulating material). Such grooves may, for example, be utilized to balance thermal expansion, to add compliance or stiffness (e.g., with a stiffening ring or member), etc.

The grooves may, for example, be positioned outside a footprint of the semiconductor die. For example, the grooves may be positioned laterally between the edges of the semiconductor die and the edges of the singulated electronic device (e.g., centered between such edges, etc.). The width of a groove may, for example, be 25% to 75% of the lateral distance between the lateral edge of the semiconductor die and the lateral edge of the singulated electronic device (e.g., the lateral side of the encapsulating material). The grooves may, for example, comprise a depth (or bottom surface) that extends to or below the top side of the semiconductor die. In an example implementation, the grooves comprise a depth (or bottom surface) that is between the top and bottom sides of the semiconductor die. Though the grooves are shown with a generally square or rectangular cross-section, they may also have sloped side surfaces (e.g., with the grooves wider at the open end than at the closed end), a rounded bottom surface, etc.

Block 160 may comprise forming the grooves in any of a variety of manners. For example, mold protrusions corresponding to the grooves may be utilized to form the grooves during a molding process used to form the encapsulating material. Also for example, the grooves may be formed after the encapsulating material is formed (e.g., molded, flooded, etc.), for example by mechanically removing encapsulating material to form the grooves, utilizing a laser or other directed energy technology to remove encapsulating material to form the grooves, etc.

Figure 4E:
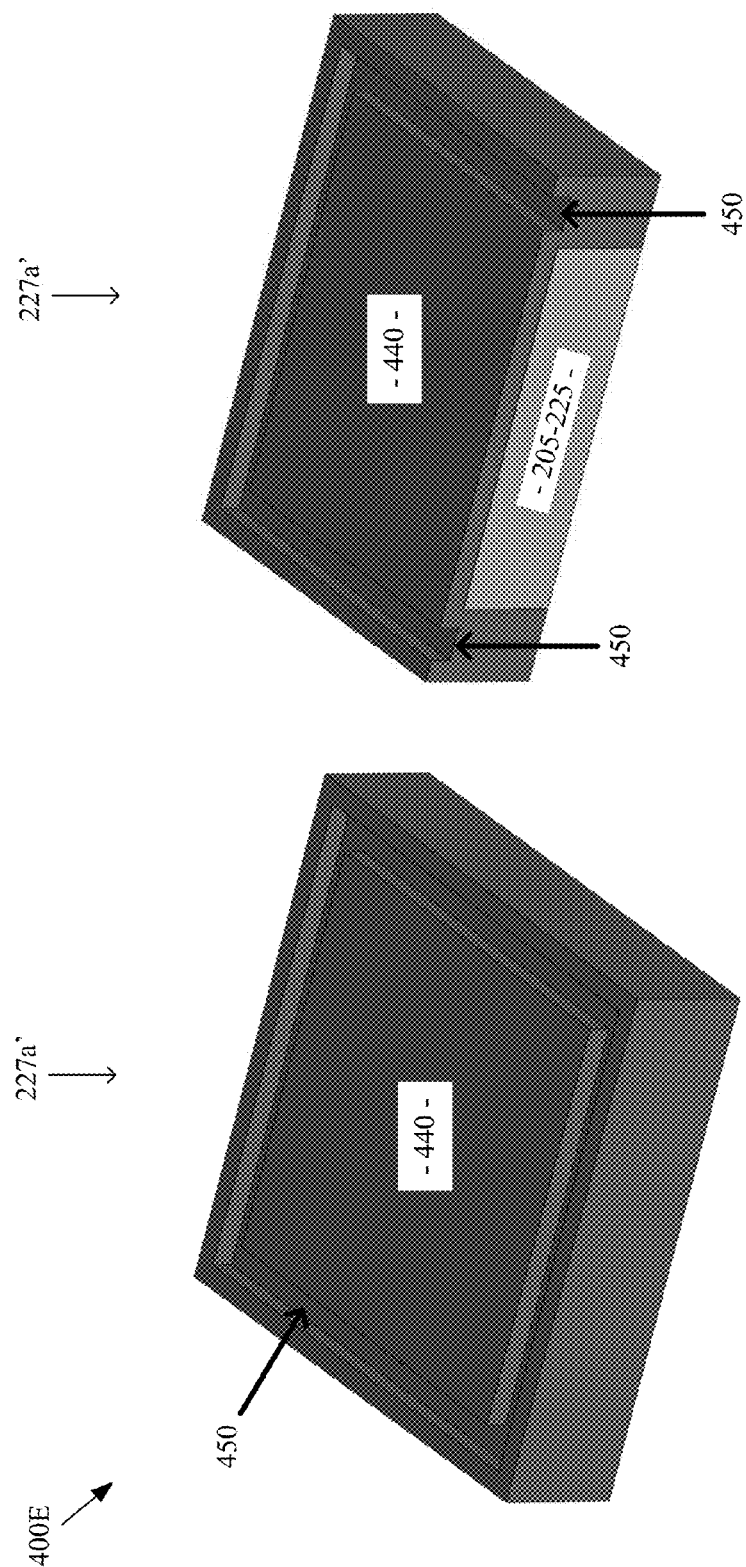

An example implementation 400A showing various aspects of block 160 is shown at FIG. 4A. The example implementation 400A (or assembly, sub-assembly, package, etc.) shows the example implementation 200F with grooves 450 formed in the top surface of the encapsulating material 440. As shown in FIG. 4E, the grooves 450 may comprise a single groove that extends around the lateral perimeter of the semiconductor die. In another example scenario, the grooves 450 may comprise a series of grooves, one along each side of the semiconductor die, where such grooves 450 need not be connected to each other. In yet another example scenario, there may be a plurality of grooves off each side of the semiconductor die.

As discussed here, various blocks of the example method 100 (or portions thereof) may be omitted or added without departing from the scope of this disclosure. In an example implementation, blocks 120 and 130 may be omitted, for example resulting in an example in which the metal studs and dielectric layer are not present. An example implementation 400B is shown at FIG. 4B. For example, compared to the example implementation 400A of FIG. 4A, the metal studs 220 and the dielectric layer 225 are omitted.

In an example implementation, the groove(s) may be left empty. In another example implementation, however, the groove(s) may be filled with another material (e.g., a material with a higher modulus than the encapsulating material, a metal, an epoxy, any of the dielectric materials discussed herein, etc.). An example implementation 400C showing such filled grooves is shown at FIG. 4C. Relative to the example implementation 400A of FIG. 4A, the example implementation 400C has the grooves 450 filled with a filler material 470. In a scenario in which the filler material 470 has a higher modulus than the encapsulating material 440, such filler material 470 may act as a stiffening ring for the electronic device. Any of a variety of materials with any of a variety of respective modulus values (e.g., greater or less than the modulus of the encapsulating material 440) may be utilized, for example to balance thermal stress, add stiffness or compliance where needed, etc.

An example implementation 400D (or electronic device 227a") after singulation is shown in FIG. 4D. Compared to the example implementation 200J of FIG. 2J, the example implementation 400D includes the grooves 450 in the upper surface 440U of the encapsulating material 440, where the grooves 450 are filled with a filler material 470.

FIG. 4E provides a perspective drawing and a perspective sectional drawing of an example electronic device, in accordance with various aspects of the present disclosure. The drawings of FIG. 4E show the semiconductor die 227a' (or portions thereof), for example which includes the semiconductor material 205, bond pads 210, passivation layer 215, metal studs 220, dielectric layer 225, encapsulating material 440, and groove(s) 450, discussed herein. For illustrative clarity, the RD structure 250 is not shown in FIG. 4E.

The discussion herein included numerous illustrative figures that showed various portions of an electronic assembly and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide an electronic device and a method of manufacturing an electronic device. As non-limiting examples, various aspects of this disclosure provide various methods of manufacturing electronic devices, and electronic devices manufactured thereby, that comprise utilizing metal studs to further set a semiconductor die into the encapsulant. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor device comprising:
 a first semiconductor die having a first top die side, a first bottom die side comprising a first bond pad, and first lateral die sides between the first top and first bottom die sides;
 a first dielectric layer (DL) having a first top DL side coupled to the first bottom die side, a first bottom DL side, and first lateral DL sides between the first top and first bottom DL sides;
 a first metal post having a first top post side attached to the first bond pad, a first bottom post side, and a first lateral post surface between the first top and first bottom post sides, where the first metal post extends vertically through the first dielectric layer from the first bond pad to the first bottom DL side;
 a second semiconductor die having a second top die side, a second bottom die side comprising a second bond pad, and second lateral die sides between the second top and second bottom die sides;
 a second dielectric layer (DL) having a second top DL side coupled to the second bottom die side, a second bottom DL side, and second lateral DL sides between the second top and second bottom DL sides;

a second metal post having a second top post side attached to the second bond pad, a second bottom post side, and a second lateral post surface between the second top and second bottom post sides, where the second metal post extends vertically through the second dielectric layer from the second bond pad to the second bottom DL side; and an encapsulating material contacting and surrounding the first and second lateral die sides and the first and second lateral DL sides, the encapsulating material having a top encapsulant side, a bottom encapsulant side, and lateral encapsulant sides between the top and bottom encapsulant sides, wherein:
the first DL has a first DL thickness, and the second DL has a second DL thickness greater than the first DL thickness; and
the first semiconductor die has a first die thickness, and the second semiconductor die has a second die thickness less than the first die thickness.

2. The semiconductor device of claim 1, wherein the encapsulating material covers the first top die side and/or the second top die side.

3. The semiconductor device of claim 1, wherein the first semiconductor die comprises a first die passivation layer having a bottom side coupled to the first top DL side.

4. The semiconductor device of claim 3, wherein the first bottom post side is coplanar with the second bottom post side, the first bottom DL side, and the second bottom DL side.

5. The semiconductor device of claim 1, wherein a first of the first lateral DL sides and a first of the second lateral DL sides are generally parallel and laterally separated by only the encapsulating material.

6. The semiconductor device of claim 1, comprising a first die passivation layer that covers a portion of a bottom side of the first bond pad, and wherein a portion of the first dielectric layer is directly laterally between the first metal post and the first die passivation layer.

7. The semiconductor device of claim 1, wherein the top encapsulant side comprises a groove outside the footprints of the first and second semiconductor dies.

\* \* \* \* \*